(12) United States Patent
Minamide et al.

(10) Patent No.: US 8,426,087 B2
(45) Date of Patent: Apr. 23, 2013

(54) PHOTOMASK, MANUFACTURING APPARATUS AND METHOD OF SEMICONDUCTOR DEVICE USING THE SAME, AND PHOTOMASK FEATURE LAYOUT METHOD

(75) Inventors: Ayumi Minamide, Kanagawa (JP); Mitsuru Okuno, Kanagawa (JP); Akemi Moniwa, Kanagawa (JP); Manabu Ishibashi, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 132 days.

(21) Appl. No.: 13/187,955

(22) Filed: Jul. 21, 2011

(65) Prior Publication Data
US 2012/0052419 A1     Mar. 1, 2012

(30) Foreign Application Priority Data
Sep. 1, 2010   (JP) .................................. 2010-195932

(51) Int. Cl.
*G03F 1/38* (2012.01)

(52) U.S. Cl.
USPC ............................................................ 430/5

(58) Field of Classification Search .............. 430/5, 394; 355/53; 716/55
See application file for complete search history.

(56) References Cited

U.S. PATENT DOCUMENTS

| 7,214,453 | B2 | 5/2007 | Yamazoe et al. |
| 2005/0037267 | A1 | 2/2005 | Yamazoe et al. |
| 2009/0239159 | A1 | 9/2009 | Minamide et al. |

FOREIGN PATENT DOCUMENTS

| JP | 2004-272228 | 9/2004 |
| JP | 2005-055878 | 3/2005 |
| JP | 2009-229669 | 10/2009 |

*Primary Examiner* — Stephen Rosasco
(74) *Attorney, Agent, or Firm* — McDermott Will & Emery LLP

(57) ABSTRACT

A photomask is provided which can have a large depth of focus even if four main features are annularly arranged at random.

The photomask has four annularly arranged main features based on design information of a circuit feature to be formed on a wafer, and a sub-feature is laid at an intersection point of two diagonal lines of a quadrangle formed by four vertices inside the four main features in order to increase a depth of focus of an exposure feature. Therefore, the depth of focus can be increased even if the main features are not arranged at a constant pitch.

10 Claims, 20 Drawing Sheets

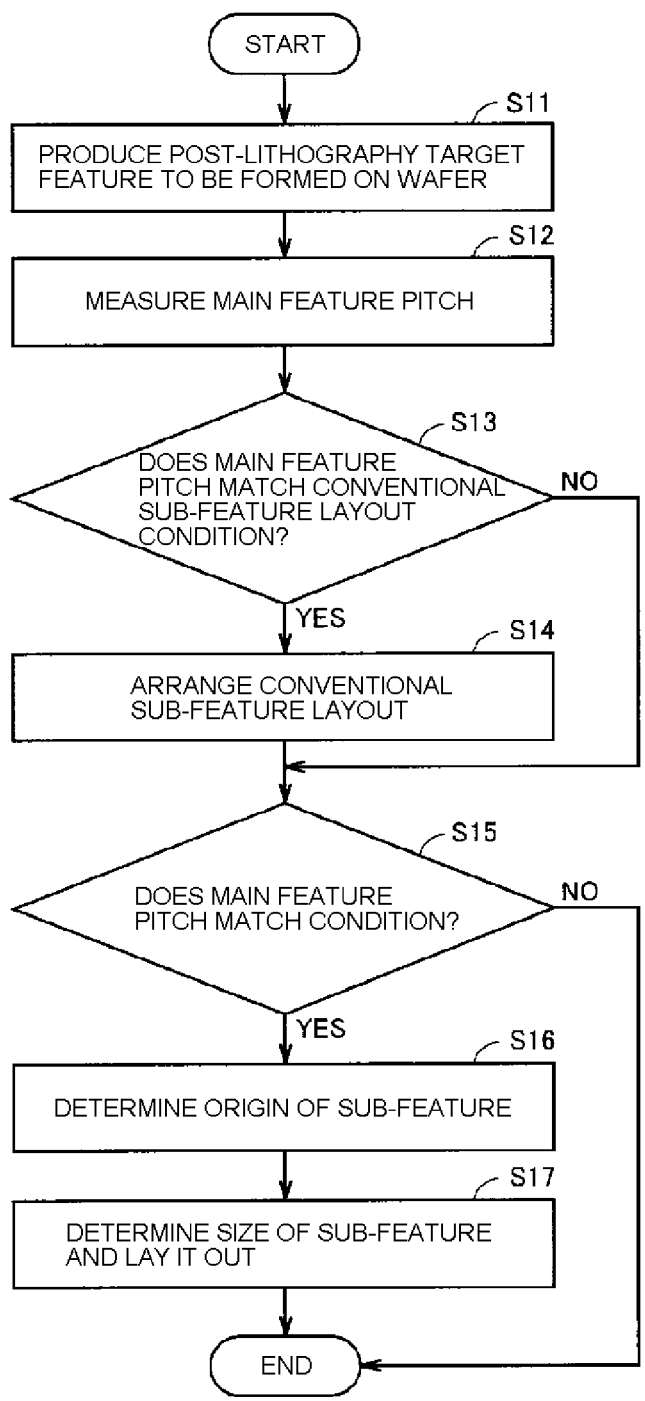

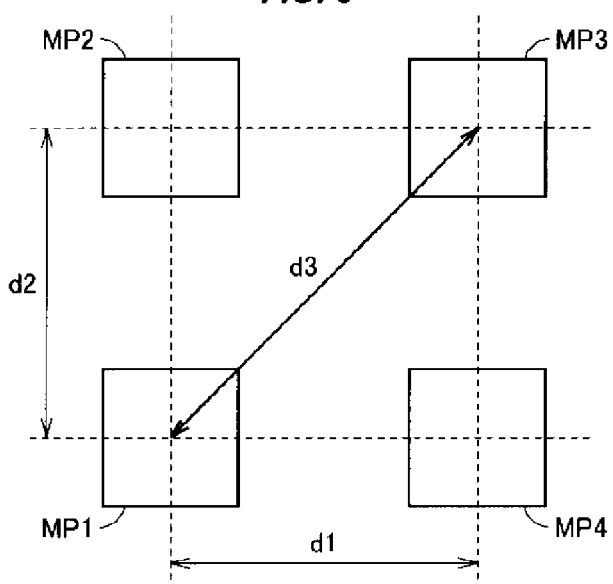

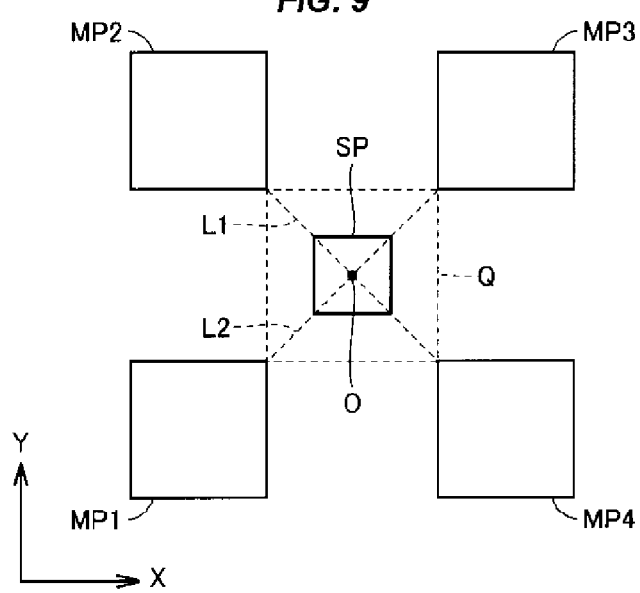

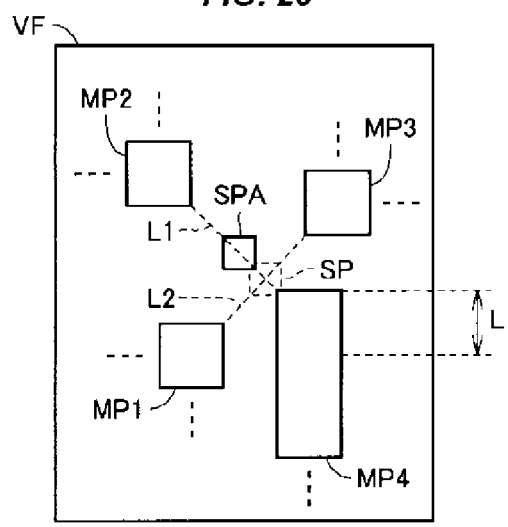

PHOTOMASK, MANUFACTURING APPARATUS AND METHOD OF SEMICONDUCTOR DEVICE USING THE SAME, AND PHOTOMASK FEATURE LAYOUT METHOD

CROSS-REFERENCE TO RELATED APPLICATION

The disclosure of Japanese Patent Application No. 2010-195932 filed on Sep. 1, 2010 including the specification, drawings and abstract is incorporated herein by reference in its entirety.

BACKGROUND

The present invention relates to a photomask, a manufacturing apparatus and method of semiconductor device using the same, and a photomask feature layout method, and particularly relates to a photomask having a sub-feature for increasing a depth of focus of an exposure feature, a manufacturing apparatus and a method of a semiconductor device using the same, and a photomask feature layout method.

The progress of semiconductor manufacturing technology has brought about increasingly miniaturized circuit features that are formed on a substrate through the lithography process. In the lithography process, a main feature with a shape and dimension in accordance with the circuit feature is formed on a photomask. In addition, a photoresist layer is coated on the surface of the substrate, light is irradiated to the photoresist layer via the photomask from a light source to form an exposure feature on the photoresist layer. The photoresist layer is then developed to remove unnecessary parts, and the substrate is etched to form a circuit feature on the surface of the substrate.

In order to form a more miniature circuit feature, it is necessary to form a high-resolution exposure feature having a sufficient depth of focus (DOF). However, light passing through a main feature arranged in an isolated manner cannot particularly provide a sufficient depth of focus due to its limited wavelength. Therefore, a method is known in which, in addition to the main feature, a sub-feature which acts as the Sub-Resolution Assist Feature (SRAF) is laid near the main feature to increase the resolution. The sub-feature is formed on the surface of the substrate with a dimension smaller than the resolution limit.

In patent document 1 (Japanese Patent Laid-Open No. 2009-229669), for example, a square or rectangular sub-feature is laid along each side of a square or rectangular main feature. In patent document 2 (Japanese Patent Laid-Open No. 2005-55878) and patent document 3 (Japanese Patent Laid-Open No. 2004-272228), a number of sub-features are arranged at a constant pitch around a plurality of main features arranged at a constant pitch.

With patent document 1, however, since no sub-feature is laid on a part not facing the side of the main feature, the size of the depth of focus has not been sufficiently satisfactory. Additionally, with patent documents 2 and 3, it has been impossible to lay a sub-feature if a plurality of main features is not arranged in X- and Y-directions at a constant pitch.

Accordingly, it is a main object of the present invention to provide a photomask which can provide a large depth of focus even if four main features are annularly arranged at random, a manufacturing apparatus and method of a semiconductor device using the same, and a photomask feature layout method.

SUMMARY

A photomask according to the present invention comprises four main features formed based on design information of a circuit feature to be formed on a substrate in order to form an exposure feature corresponding to the circuit feature on the surface of the substrate. Each of the main features is formed into a square or rectangular shape and has a first side extending in a first direction and a second side extending in a second direction perpendicular to the first direction. The four main features are annularly arranged so that a quadrangle is formed by four vertices inside the four main features, when viewed from the center of the four main features. The photomask further comprises a first sub-feature laid at a predetermined position in the quadrangle defined based on the positions of the four vertices of the quadrangle in order to increase the depth of focus of the exposure feature. The first sub-feature is formed into a square or rectangular shape, and has a third side extending in the first direction and a fourth side extending in the second direction.

With the photomask according to the present invention, four main features are annularly arranged, a quadrangle is formed by the four vertices inside the four main features, and a first sub-feature is laid at a predetermined position in the quadrangle defined based on the positions of four vertices. Therefore, a large depth of focus can be obtained even if the four main features are annularly arranged at random.

BRIEF DESCRIPTION OF THE DRAWINGS

FIG. 6 is a flow chart illustrating step S2 shown in FIG. 5 in detail;

FIG. 8 is an explanatory diagram of steps S12 and S15 shown in FIG. 6;

FIG. 9 is an explanatory diagram of steps S16 and S17 shown in FIG. 6;

FIG. 20 illustrates an exemplary variation of an embodiment 4.

DETAILED DESCRIPTION

[Embodiment 1] <Apparatus Configuration>

Figure 1:
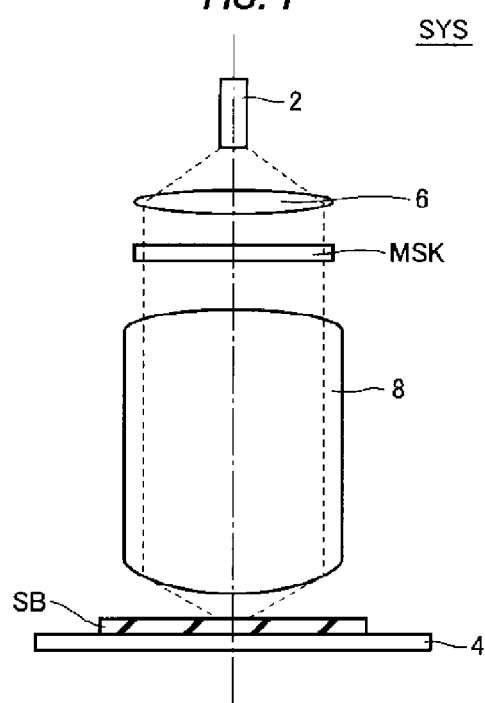
FIG. 1 illustrates the main part of a manufacturing apparatus of semiconductor device according to an embodiment 1 of the invention.

A manufacturing apparatus SYS of the semiconductor device according to an embodiment 1 of the present invention transfers an exposure feature produced by a photomask MSK to a photoresist layer on the surface of a wafer SB as shown in FIG. 1. The manufacturing apparatus SYS includes a light source 2 which emits light to produce an exposure feature, a lens system 6, the photomask MSK having a main feature corresponding to the exposure feature to be transferred on the wafer SB, a projection lens system 8, and a stage 4 having the wafer SB placed thereon. The light source 2 emits a single wavelength light beam having a wavelength of 193 nm, for example.

The manufacturing apparatus SYS, including an exposure device referred to as a stepper or a scanner, shrinks an exposure feature, which is produced as light from the light source 2 passes the photomask MSK, by the projection lens system 8, and transfers it on a photoresist layer of the surface of the wafer SB. Therefore, a minuter exposure feature than the main feature formed on the photomask MSK can be transferred on the wafer SB. Developing the photoresist layer removes the photoresist layer of unnecessary parts, whereby a post-lithography target feature is formed on the surface of the wafer SB. Subsequently, a circuit feature is formed on the surface of the wafer SB by etching the wafer SB.

Since a CD (Critical Dimension) shift occurs by etching, the dimension of the target feature is set, taking into account the CD shift in the dimension of the circuit feature (design feature). The dimension of the main feature is set based on the dimension of the target feature. Since the main feature is shrunk by the projection lens system 8 and transferred on the surface of the wafer SB as described above feature size on mask is 4 or 5 times of feature size on the wafer. However, to make it simple, the features size will be explained entirely based on the surface of the wafer SB here after.

<Photomask>

The photomask MSK includes a main feature for forming an exposure feature, and a sub-feature for increasing the depth of focus of the exposure feature. The sub-feature is one referred to as the non-resolution dummy or SRAF. The effect of the sub-feature will be described next.

FIGS. 2A to 2E are explanatory diagrams of the improvement of optical characteristic by the sub-feature. FIGS. 2A to 2E compare the photomask having only a square main feature MP formed in the center of mask with a photomask further having four sub-features SP, corresponding to each side of the main feature MP, arranged at positions separated from each side by a predetermined distance. Although the above description exemplifies a dark field mask with main feature MP being the transparent portion, assuming that each photomask is an attenuated phase shift mask, it is known that an ordinary binary mask or a clear field mask with the main feature MP being the opaque portion is also effective for improving the optical characteristic by the sub-feature SP.

The main feature MP and the sub-feature SP, which are regions having a higher transmittance than other regions, also control the phase for incident light.

The main feature MP is formed with a size that allows a sufficient amount of light to be transmitted, and an exposure feature having a high light intensity in a region corresponding to the main feature MP in term of its light intensity profile is produced when light from the light source is irradiated to the photomask.

On the other hand, the sub-feature SP generates, in an auxiliary manner, light having a higher order to increase the depth of focus of the exposure feature produced by the main feature MP. This is because sufficient resolution cannot be obtained only by the light passing through the main feature MP formed in isolation. The sub-feature SP, having a transmittance similar to that of the main feature MP, is set to a size (below the resolution limit) such that the light that passed through the sub-feature SP does not resolve an image on the wafer, while assisting formation of an exposure feature corresponding to the main feature MP.

The phenomenon of resolving/not resolving an image on the wafer is determined in accordance with the numerical aperture of the projection lens system 8 and the wavelength of the light irradiated from the light source 2. Generally, resolution can be expressed by $k1 \times \lambda/NA$, where $\lambda$ is the wavelength of the light from the light source 2, NA is the numerical aperture of the lens, and k1 is the proportion coefficient determined by a process or the like. Therefore, the aperture area (area of a region having a high transmittance) of the main feature and the sub-feature can be determined in accordance with the wavelength of the irradiated light $\lambda$ and NA, based on the formula expressing the resolution.

Figure 2:
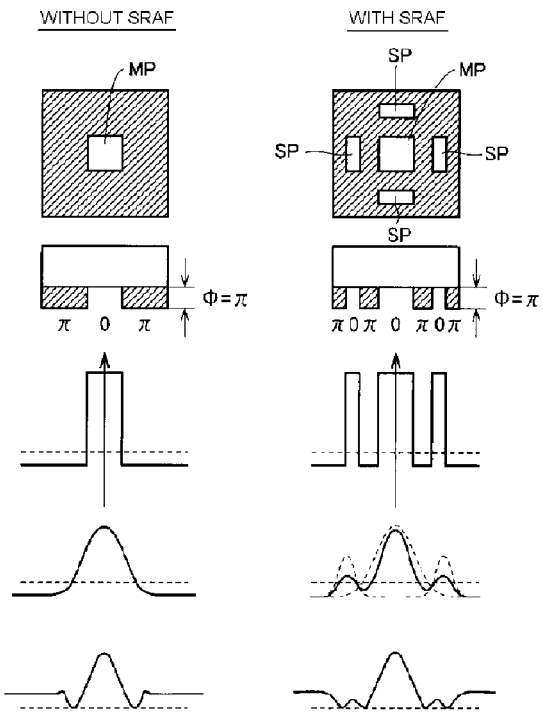
FIG. 2 is an explanatory diagram of an effect of a sub-feature of the photomask shown in FIG. 1.

It can be seen that the profile of the exposure feature on the wafer varies more steeply by forming the sub-feature SP close to the main feature MP (see FIG. 2E).

<Feature Data Production Device>

Figure 3:
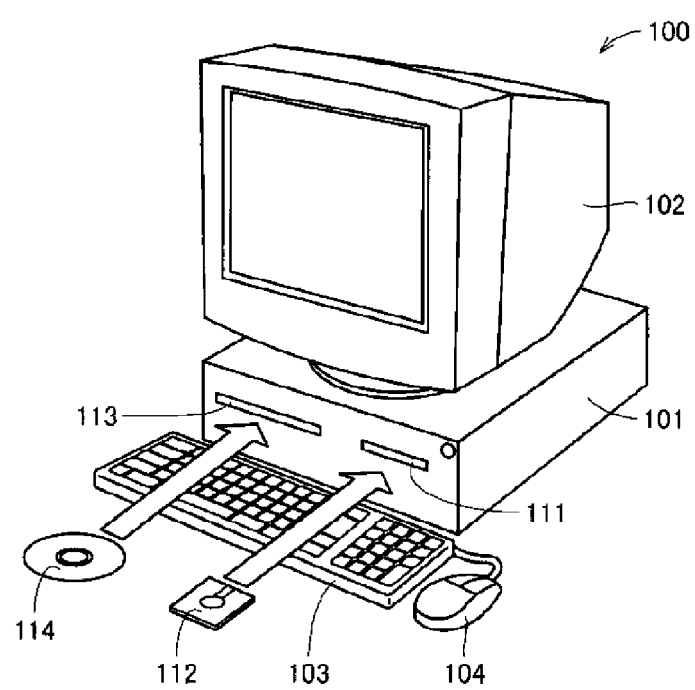
FIG. 3 illustrates a configuration of a feature data production device included in the semiconductor manufacturing apparatus shown in FIG. 1.
Figure 4:
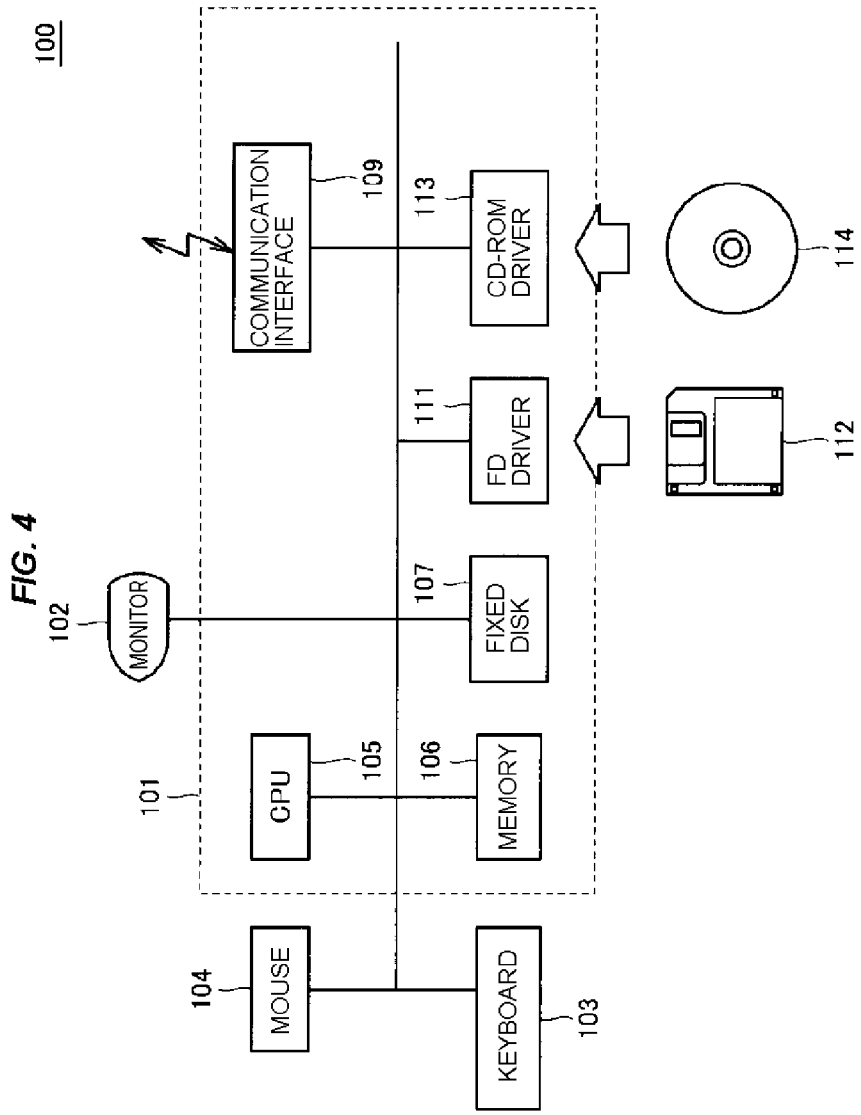
FIG. 4 is a block diagram illustrating a configuration of the feature data production device shown in FIG. 3.

The layout of the photomask MSK described above is determined, representatively, by a computer-based feature data production device. FIG. 3 is a perspective view illustrating a computer 100 which is a representative hardware configuration for realizing a feature data production device. FIG. 4 is a schematic view illustrating the hardware configuration of the computer 100.

Referring to FIG. 3, the computer 100 includes a FD (Flexible Disk) driver 111, a computer main body 101 equipped with a CD-ROM (Compact Disk-Read Only Memory) driver 113, a monitor 102, a keyboard 103, and a mouse 104.

Referring to FIG. 4, the computer main body 101 includes, in addition to the CD-ROM driver 113 and the FD driver 111 shown in FIG. 3, a CPU (Central Processing Unit) 105 as an arithmetic device, a memory 106, a fixed disk 107 as a storage unit, and a communication interface 109, which are coupled to each other via a bus.

The feature data production device is implemented by the CPU 105 using computer hardware such as the memory 106 to execute a program. Generally, such a program circulates in a form stored on a recording medium such as an FD 112 or a CD-ROM 114, or via a network. Such a program is then read from the recording medium by the FD driver 111 or the CD-ROM driver 113, or received by the communication interface 109, to be stored in the fixed disk 107. Furthermore, such a program is read from the fixed disk 107 into the memory 106 and executed by the CPU 105.

The CPU 105, which is an arithmetic processing unit to perform various arithmetic and logic operations, determines the layout of the photomask MSK according to this embodiment by sequentially executing programmed instructions. The memory 106 stores a variety of information in accordance with execution of the program by the CPU 105.

The monitor 102, which is a display unit for displaying information output from the CPU 105, includes an LCD (Liquid Crystal Display) or a CRT (Cathode Ray Tube), for example. In other words, the layout of the photomask MSK being produced or after completion is displayed on the monitor 102.

The mouse 104 accepts an instruction from a user according to an operation such as clicking or sliding. The keyboard 103 accepts instructions from the user in accordance with the pressed key.

The communication interface 109, which is a device for establishing communication between the computer 100 and other devices, accepts design information of the circuit feature to be formed on the wafer SB, and outputs feature data representing the determined layout of the photomask MSK to the outside.

The photomask MSK is produced based on the feature data output by such a feature data production device. The actual preparation process of the photomask MSK can use a well-known technology.

<Overall Process>

Figure 5:
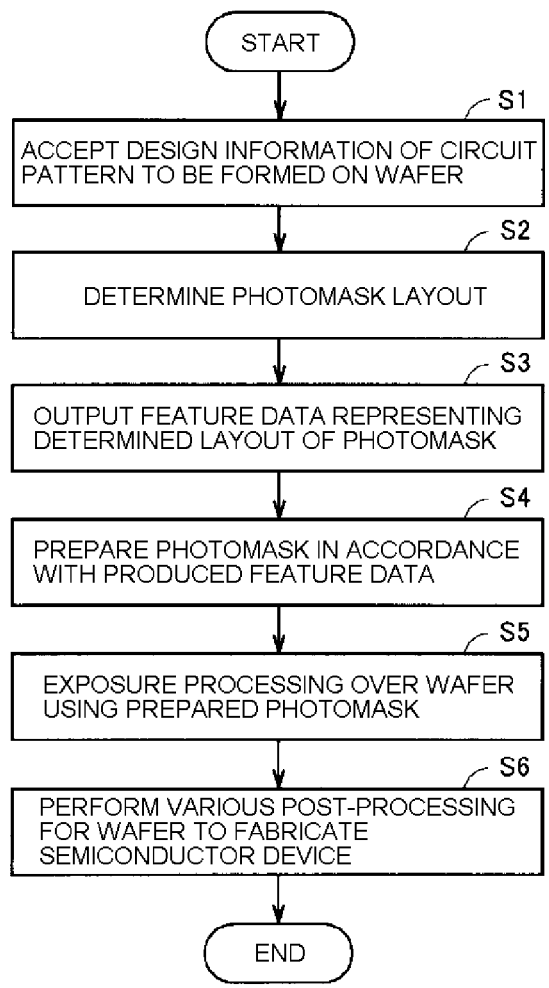
FIG. 5 is a flow chart illustrating a method of fabricating a semiconductor device by the manufacturing apparatus shown in FIGS. 1 to 4.

FIG. 5 is a flowchart illustrating a processing procedure in accordance with a method of fabricating a semiconductor device. Referring to FIG. 5, the layout of the photomask MSK is first determined by the feature data production device. Specifically, the feature data production device accepts, at step S1, design information of the circuit feature to be formed on the wafer SB.

Next, at step S2, the feature data production device determines the layout of the main feature MP and the sub-feature SP on the photomask MSK, based on the design information accepted at step S1. Subsequently, at step S3, the feature data production device outputs the feature data representing the determined layout of the photomask MSK. Here, Optical Proximity Correction (OPC) may be performed on the main feature MP. When performing OPC, it may be performed without changing the shape of the sub-feature SP determined at step S2, or fine tuning of the shape/position of the sub-feature SP may be simultaneously performed.

Next, at step S4, the photomask MSK is prepared in accordance with the feature data produced with the feature data production device. Subsequently, at step S5, an exposure process is performed on the wafer SB using the photomask MSK prepared at step S4. Furthermore, at step S6, the semiconductor device is fabricated by performing various post-processing for the wafer SB.

<Feature Layout Method>

FIG. 6 is a flow chart illustrating step S2 of FIG. 5 in detail. In FIG. 6, the post-lithography target feature to be formed on the wafer SB is produced, based on the design information accepted at step S1. The design information includes the dimension, shape, position of the circuit feature (design feature) to be formed on the wafer SB. The target feature is produced by taking into account the CD shift due to etching in the circuit feature.

Figure 7A:
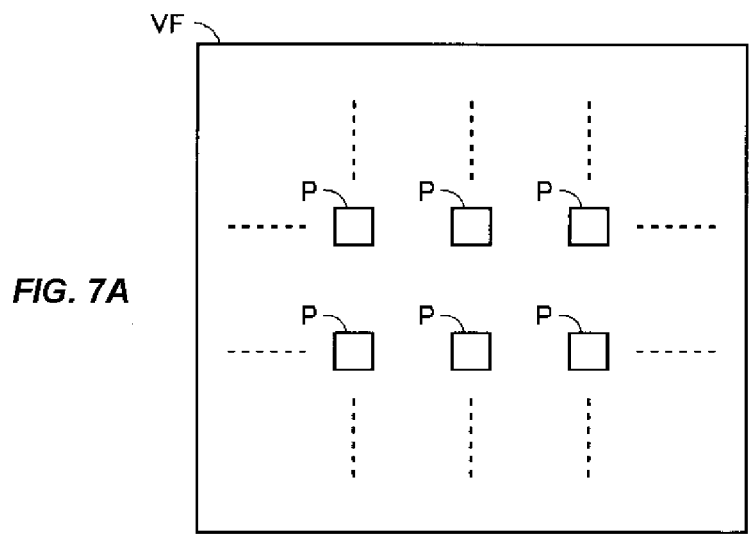
FIG. 7 is an explanatory diagram of step S11 shown in FIG. 6.
Figure 7B:
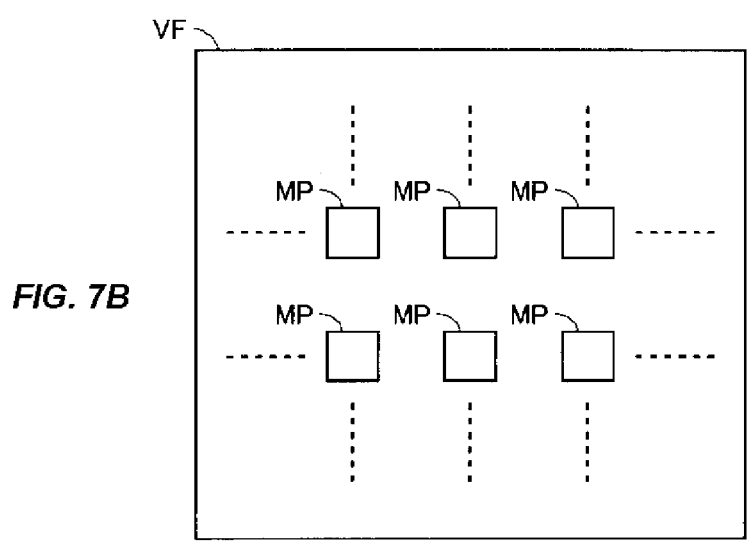

FIG. 7A illustrates a plurality of circuit features P arranged on a virtual plane VF corresponding to the surface of the photomask MSK. The circuit feature P is, for example, a contact hole of the semiconductor device, formed into a square shape. The circuit features P are arranged in a plurality of rows and columns with a predetermined pitch. FIG. 7B illustrates the main features MP arranged on the virtual plane VF. Each of the main features MP is formed by enlarging the circuit features P, taking into account the CD shift due to etching.

Returning to FIG. 6, the pitch of the main features MP is measured at step S12 and it is determined at step S13 whether or not the pitch of the main features MP matches the conventional sub-feature SP layout condition. If the conventional sub-feature SP layout condition is matched at step S13, the conventional sub-feature layout is arranged at step S14, whereas the process flow proceeds to step S15 if the conventional sub-feature SP layout condition is not matched at step S13.

At step S15, it is determined whether or not each pitch measured at step S12 matches a predetermined condition. Specifically, as shown in FIG. 8, annularly arranged and adjacent four main features MP1 to MP4 are representatively extracted, whereby the horizontal pitch (the distance between the center points of the main features MP1 and MP4) d1, the vertical pitch (the distance between the center points of the main features MP1 and MP2) d2, and the diagonal pitch (the distance between the center points of the main features MP1 and MP3) d3 are measured.

Assuming that the proportional constant k1 is 0.37, the light wavelength λ of the light source 2 is 193 nm, and NA of the projection lens system 8 is 1.3, the limit resolution (k1× λ/NA) is 55 nm. Therefore, the dimension of the main feature MP is equal to or larger than 55 nm, whereas the dimension of the sub-feature SP is smaller than 55 nm. The pitch between the main features MP in which the sub-feature SP can be inserted is four times the limit resolution or more, i.e., 55×4=220 nm or more.

If the pitch between the main features MP is smaller than 220 nm, inserting the sub-feature SP between two adjacent main features MP has no effect for increasing the depth of focus of the exposure feature, or rather, may degrade the contrast.

In the embodiment 1, therefore, it is determined that the condition of step S15 is matched if the diagonal pitch d3 of the main feature MP is equal to or higher than 220 nm which is four times the limit resolution, and each of horizontal pitch d1 and the vertical pitch d2 is smaller than 5 times the limit resolution.

Returning to FIG. 6, if the pitch of the main feature MP does not match the condition at step S15, the process flow proceeds to step S3 of FIG. 5 without preparing the sub-feature SP. If the pitch of the main feature MP matches the condition at step S15, the starting point of the sub-feature SP is determined at step S16, the size of the sub-feature SP is determined to lay out the sub-feature SP at step S17, and the process flow proceeds to step S3 of FIG. 5.

Specifically, as shown in FIG. 9, a quadrangle Q is formed by the four vertices inside the four main features MP1 to MP4, when viewed from the center of the four main features MP1 to MP4 extracted at step S12. Next, the intersection point O of the two diagonal lines L1 and L2 of the quadrangle Q is defined as the starting point of the sub-feature SP. In other words, the sub-feature SP is laid at the intersection point O of the two diagonal lines L1 and L2. The sub-feature SP is formed into a square shape with the intersection point O being the centroid, for example.

In addition, the main feature MP has a side extending in the X-direction (horizontal direction) and a side extending in the Y-direction (vertical direction) in the drawing, the quadrangle Q also has a side extending in the X-direction and a side extending in the Y-direction, and the sub-feature SP also has a side extending in the X-direction and a side extending in the Y-direction.

Figure 10:
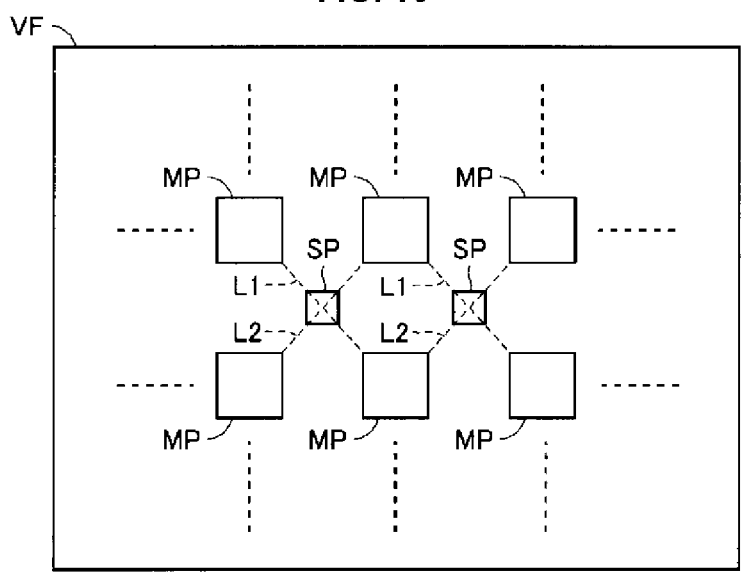
FIG. 10 is another explanatory diagram of steps S16 and S17 shown in FIG. 6.

The length of one side of the sub-feature SP is set equal to or less than 75% of the length of one side of the main feature MP, for example, 60%, and specifically set to 25 to 50 nm. The sub-feature SP is laid at a predetermined position between the four adjacent main features MP, as shown in FIG. 10.

Figure 11:
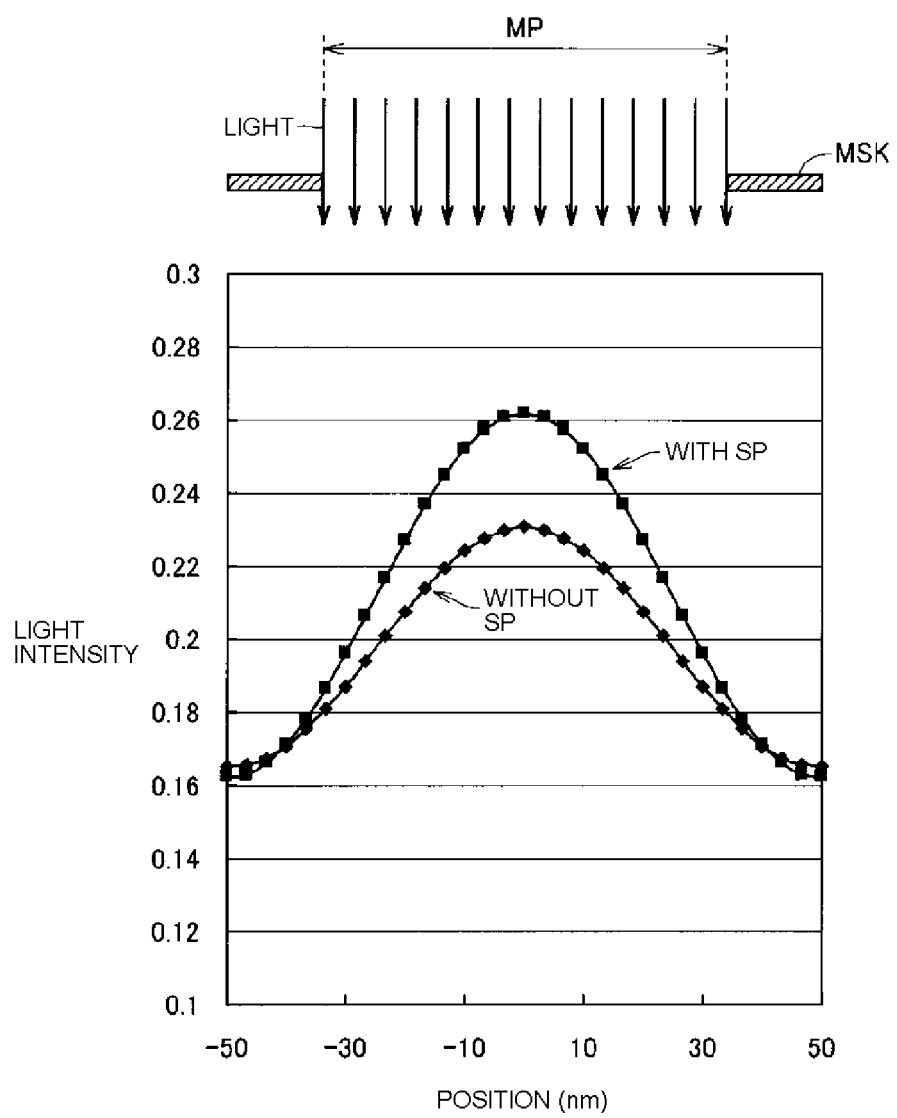
FIG. 11 is an explanatory diagram of an effect of the sub-feature shown in FIG. 10.

FIG. 11 illustrates the light intensity distribution of an exposure feature irradiated on the surface of the wafer SB, comparing the cases with and without the sub-feature SP. The width of the main feature MP is set around 60 nm. When the sub-feature SP is provided adjacent to the main feature MP, the light intensity in the exposure feature is 0.18 to 0.26. When, on the other hand, the sub-feature SP is not provided adjacent to the main feature MP, the light intensity in the exposure feature is 0.18 to 0.23. Therefore, the light intensity of the exposure feature can be increased by providing the sub-feature SP, and the depth of focus can be increased.

Since the sub-feature SP is laid at the intersection point O of the two diagonal lines L1 and L2 of the quadrangle Q formed by connecting the four vertices inside the main feature MP in the embodiment 1 as described above, the depth of focus of the exposure feature can be increased even if the sub-feature SP cannot be laid in the X- and Y-directions of the main feature MP.

In addition, since the main feature MP and the sub-feature SP respectively include a side extending in the X-direction and a side extending in the Y-direction without using sides extending in other directions, drawing time of the features MP and SP in the photomask MSK can be shortened, and the dimensional precision of the photomask MSK fabrication can be improved.

Figure 12:
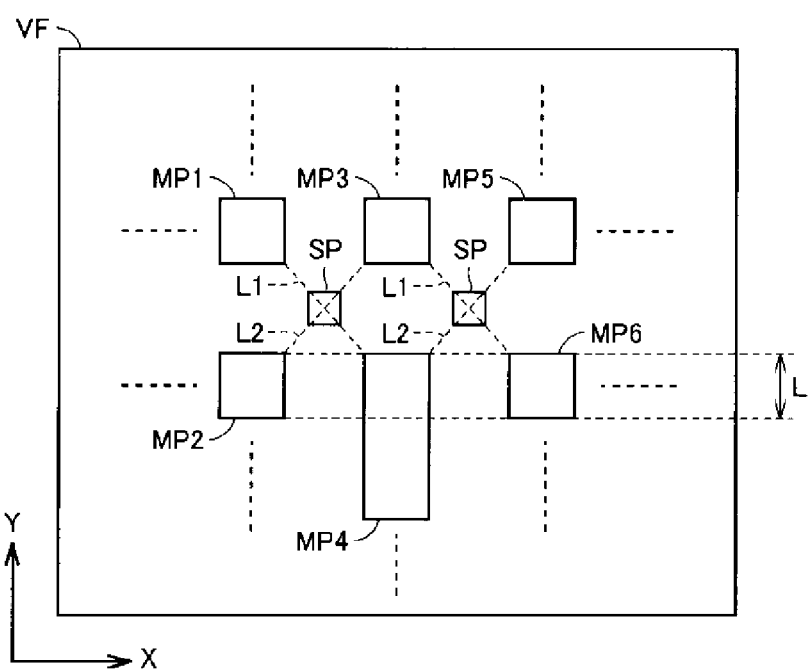
FIG. 12 illustrates an exemplary variation of the embodiment 1.

FIG. 12 illustrates an exemplary variation of the embodiment 1, in comparison with FIG. 10. In the exemplary variation of FIG. 12, one main feature MP4 out of the annularly arranged and adjacent four main features MP1 to MP4 (or MP3 to MP6) is not formed into a square shape but into a rectangular shape having the long side along the Y-axis. In this case, the length of the main feature MP4 along the Y-axis is virtually corrected to a length L of another adjacent main feature MP2 (or, MP6). Adjusting the length of the main feature MP4 along the Y-axis to another main feature MP2 (or MP6) renders the layout of the main features MP1 to MP6 identical to that shown in FIG. 10. Subsequently, the sub-feature SP is laid by the method shown in the embodiment 1. Specifically, as shown in FIG. 12, the sub-feature SP is laid at the intersection point of the two diagonal lines L1 and L2 of the quadrangle formed by connecting the vertices inside the main features MP1 to MP4 (and MP3 to MP6). This exemplary variation brings about the same effect as that of the embodiment 1.

Figure 13:
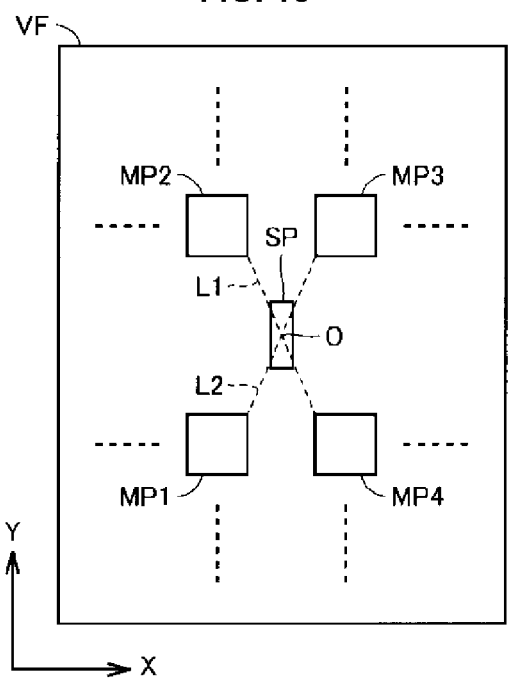
FIG. 13 illustrates another exemplary variation of the embodiment 1.

In the exemplary variation of FIG. 13, the pitch between the main features MP1 and MP4 (or MP2 and MP3) adjacent in the X-direction is set shorter than pitch between the main features MP1 and MP2 (or MP3 and MP4) adjacent in the Y-direction. In this case, the sub-feature SP is formed into a rectangular shape with the side along the Y-axis longer than the side along the X-axis. The length of the short side of the sub-feature SP is set to 20 to 50 nm and the length of the long side is set to 25 to 60 nm. This exemplary variation also brings about the same effect as that of the embodiment 1.

[Embodiment 2]

Figure 14:
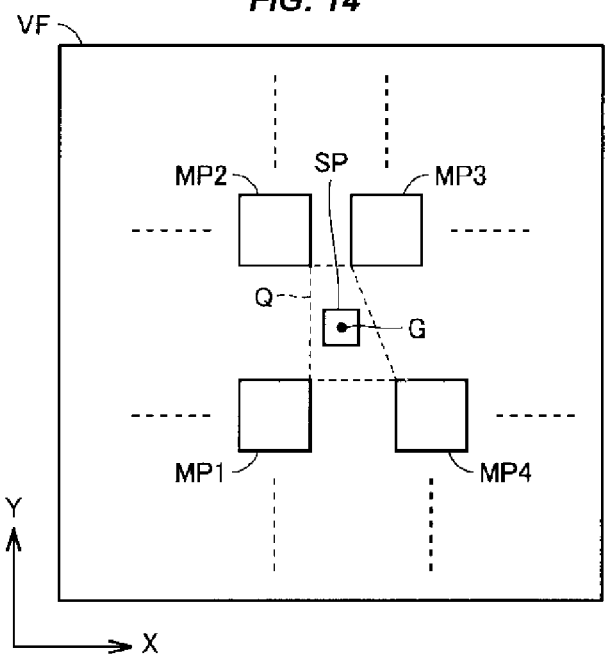
FIG. 14 illustrates a feature layout method according to an embodiment 2 of the present invention.

FIG. 14 illustrates a feature layout method according to an embodiment 2 of the present invention, in comparison with FIG. 13. In the embodiment 2 of FIG. 14, the four main features MP1 to MP4 are annularly arranged and adjacent to each other. The pitch of the main features MP1 and MP4 adjacent in the X-direction is larger than the pitch of the main features MP2 and MP3 adjacent in the X-direction. Therefore, the side between the main features MP3 and MP4, out of the four sides of the quadrangle Q formed by the four vertices inside the four main features MP1 to MP4 is extending in a direction different from both the X- and Y-directions.

The sub-feature SP is laid according to steps S11 to S17 of FIG. 6 in the embodiment 2, of which step S16 is different from that of the embodiment 1. At step S16 of the embodiment 2, the sub-feature SP is laid at the centroid G of the quadrangle Q formed by the four vertices inside the four main features MP1 to MP4. Since other steps are identical to those of the embodiment 1, description thereof is not repeated. The embodiment 2 also brings about the same effect as that of the embodiment 1.

Figure 15:
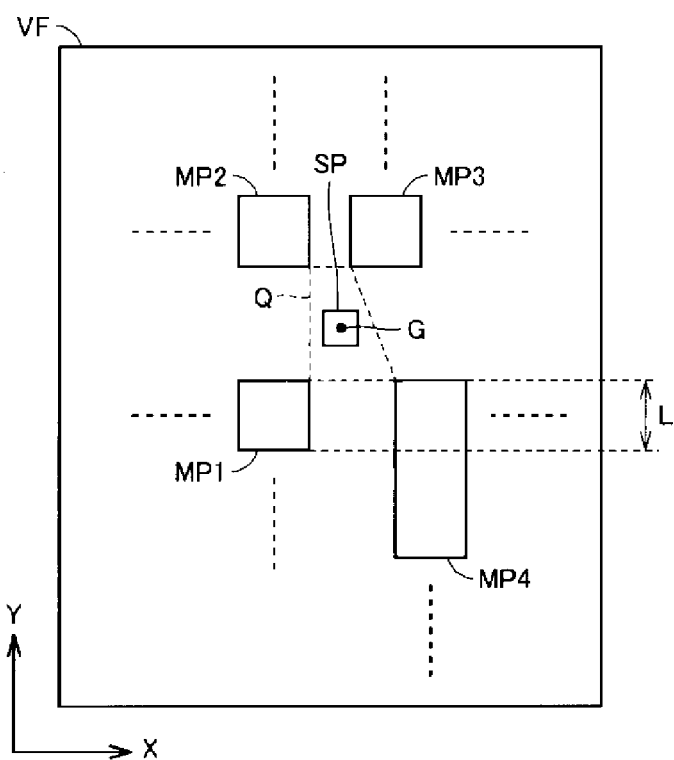
FIG. 15 illustrates an exemplary variation of the embodiment 2 of the present invention.

FIG. 15 illustrates an exemplary variation of the embodiment 2 in comparison with FIG. 14. In the exemplary variation of FIG. 15, the main feature MP4 is formed, not into a square, but into a rectangular shape having its long side along the Y-axis. In this case, the length of the main feature MP4 along the Y-axis is virtually corrected to the length L of another adjacent main feature MP1. Adjusting the length of the main feature MP4 along the Y-axis to another main feature MP1 renders the layout of the main features MP1 to MP4 identical to that shown in FIG. 14. Subsequently, the sub-feature SP is laid by the method of the embodiment 2. Specifically, as shown in FIG. 15, the sub-feature SP is laid at the centroid G of the quadrangle Q formed by connecting the four vertices inside the main features MP1 to MP4. This exemplary variation also brings about the same effect as that of the embodiment 2.

[Embodiment 3]

Figure 16:
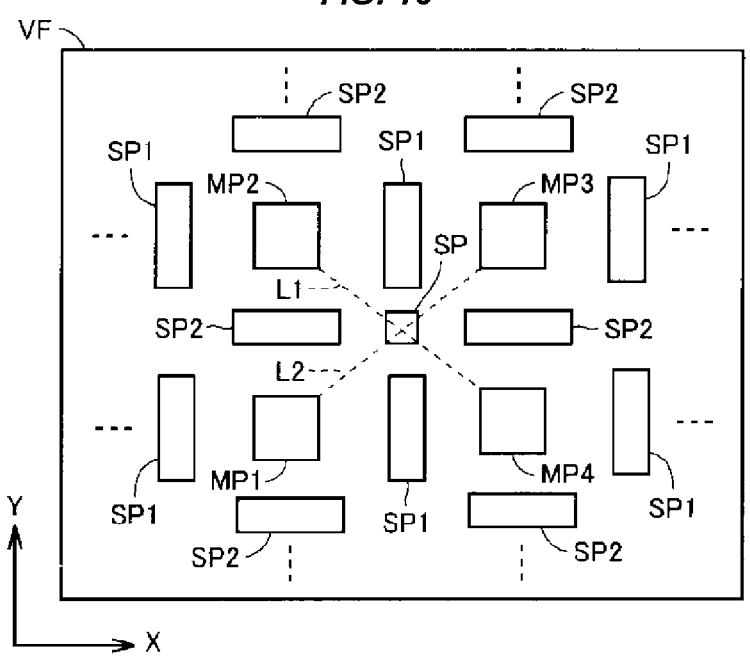
FIG. 16 illustrates a feature layout method according to an embodiment 3 of the present invention.

FIG. 16 illustrates a feature layout method according to an embodiment 3 of the present invention, in comparison with FIG. 10. In the embodiment 3 of FIG. 16, the four main features MP1 to MP4 are annularly arranged with and adjacent to each other.

The sub-feature SP is laid according to steps S11 to S17 of FIG. 6 in the embodiment 3, of which steps S15 and S16 are different from those of the embodiment 1. At step S12 of the embodiment 3, the pitch of the main features MP1 to MP4 is measured, and it is determined at step S15 whether or not each of the measured pitches matches a predetermined condition.

Specifically, the horizontal (X-direction) pitch (the distance between the center points of the main features MP1 and MP4) d1, the vertical (Y-direction) pitch (the distance between the center points of the main features MP1 and MP2) d2, and the diagonal pitch (the distance between the center points of the main features MP1 and MP3) d3 are measured.

Assuming that the limit resolution (k1×λ/NA) is 55 nm, the pitch between the main features MP in which the sub-feature SP can be inserted, is four times the limit resolution or more, i.e., 55*4=220 nm or more. In the embodiment 3, it is determined that the condition of step S15 is matched when each of the three measured pitches d1 to d3 is equal to or higher than 220 nm which is four times the limit resolution.

If the pitches d1 to d3 of the main feature MP match the condition at step S15, the starting point of the sub-feature SP is determined at step S16, the size of the sub-feature SP is determined to lay out the sub-feature SP at step S17.

Specifically, as shown in FIG. 16, the intersection point of the two diagonal lines L1 and L2 of the quadrangle connecting the four vertices inside the four main features MP1 to MP4 is defined as the starting point of the sub-feature SP. In other words, the sub-feature SP is laid at the intersection point of the two diagonal lines L1 and L2. The sub-feature SP is formed into a square shape, for example, with the intersection point being its centroid.

A position separated in the X-direction from the center point of each of the main features MP by a distance half the pitch d1 in the X-direction is defined as the starting point of the sub-feature SP1. The sub-feature SP1 is formed into a rectangular shape having its long side in the Y-direction. The sub-feature SP1 is laid on the right and left of each of the main features MP.

A position separated from the center point of each of the main features MP by a distance half the pitch d2 in the Y-direction is defined as the starting point of the sub-feature SP2. The sub-feature SP2 is formed into a rectangular shape having its long side in the X-direction. The sub-feature SP2 is laid above and below each of the main features MP. Since other steps are identical to those of the embodiment 1, description thereof is not repeated. The embodiment 3 also brings about the same effect as that of the embodiment 1.

Figure 17:
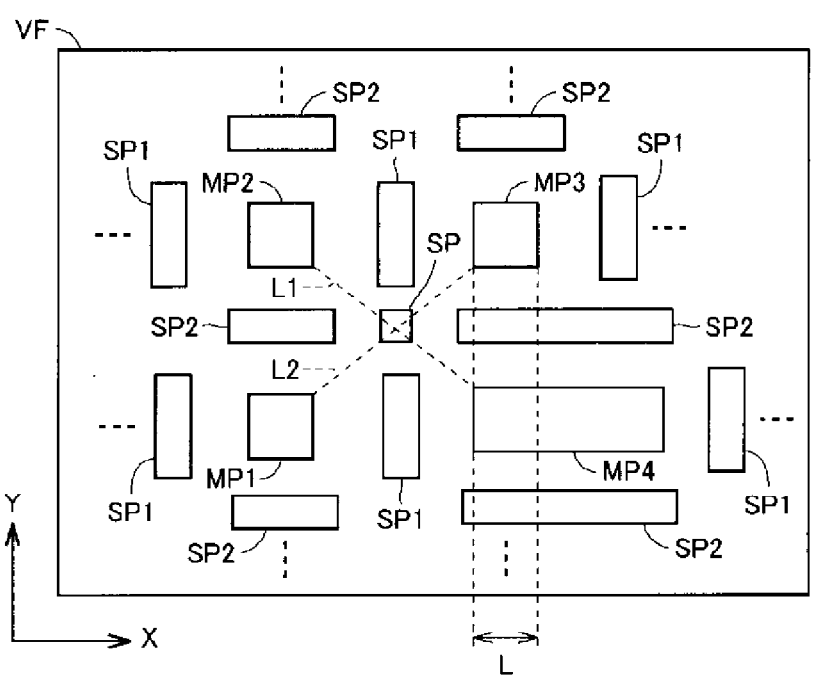
FIG. 17 illustrates an exemplary variation of the embodiment 3.

FIG. 17 illustrates an exemplary variation of the embodiment 3, in comparison with FIG. 16. In the exemplary variation of FIG. 17, the main feature MP4 is formed, not into a square, but into a rectangular shape having its long side along the X-axis. In this case, the length of the main feature MP4 along the X-axis is virtually corrected to the length L of another adjacent main feature MP3. Adjusting the length of main feature MP4 along the X-axis to another main feature MP1 renders the layout of the main features MP1 to MP4 identical to that shown in FIG. 16. Subsequently, the sub-feature SP is laid by the method of the embodiment 3. Specifically, as shown in FIG. 17, the sub-feature SP is laid at the intersection point of the two diagonal lines L1 and L2 of the quadrangle formed by connecting the four vertices inside the main features MP1 to MP4. The sub-features SP1 and SP2 are laid in the state of FIG. 17. This exemplary variation also brings about the same effect as that of the embodiment 3.

[Embodiment 4]

Figure 18:
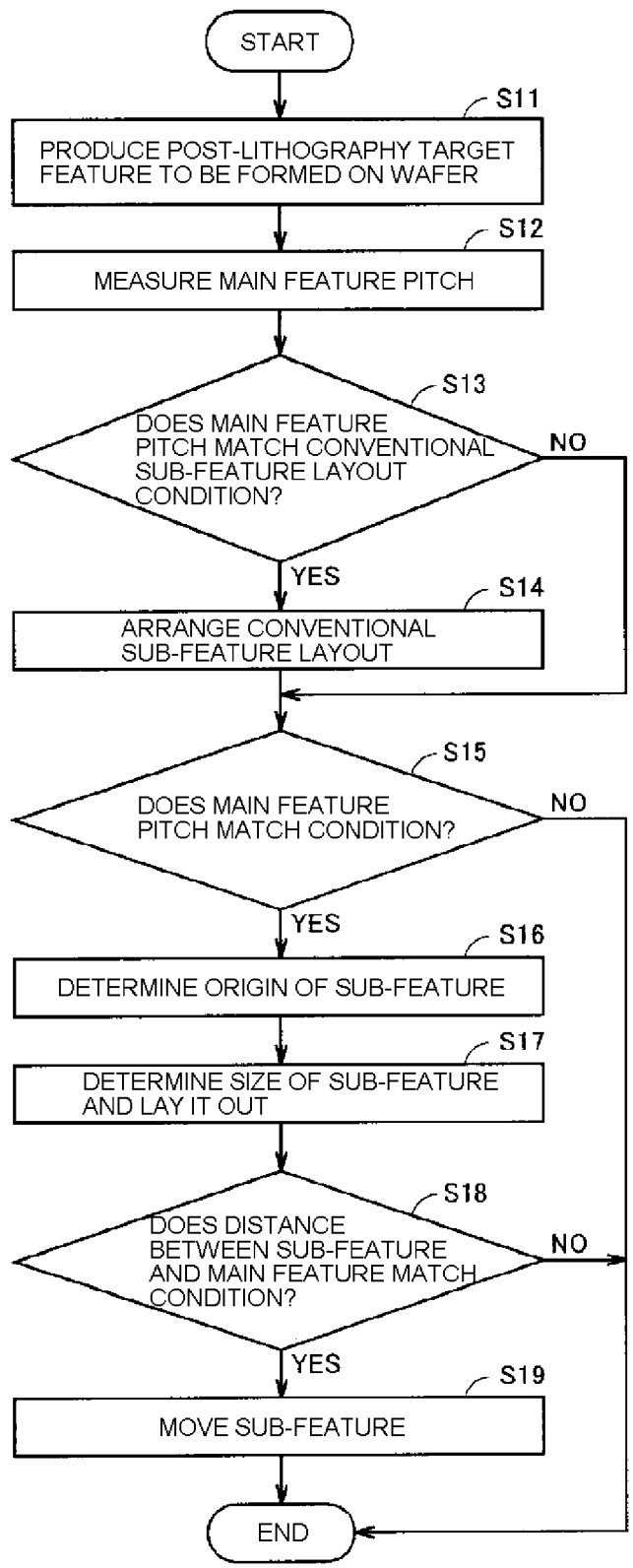
FIG. 18 is a flow chart illustrating a feature layout method according to an embodiment 4 of the present invention.
Figure 19:
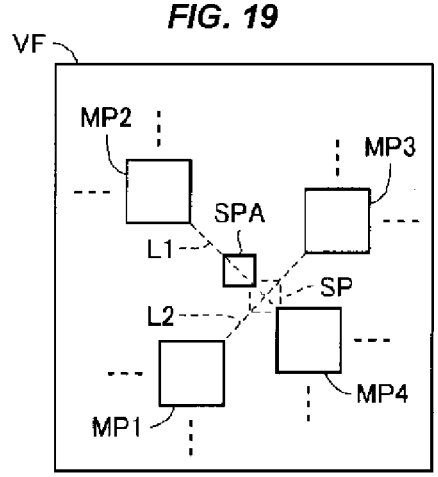
FIG. 19 illustrates a feature layout method shown in FIG. 18.

FIG. 18 is a flow chart illustrating the feature layout method according to an embodiment 4 of the present invention, in comparison with FIG. 6. In the feature layout method of FIG. 18, steps S11 to S17 are performed in a similar manner as the embodiment 1. In the embodiment 4, however, the annularly arranged and adjacent four main features MP1 to MP4 are arranged at random, as shown in FIG. 19. Therefore, there may be a case that the sub-feature SP laid at the intersection point of the two diagonal lines L1 and L2 is too close to the main feature (e.g., MP4). In such a case, the shape of the exposure feature corresponding to the main feature MP4 may degrade.

In the embodiment 4, therefore, it is determined at step S18 whether or not the distance between the sub-feature SP and the main feature MP matches a predetermined condition. Specifically, it is determined whether or not the distance between the sub-feature SP and the main feature MP is within a 60% distance (33 nm, here) of the limit resolution. If a predetermined condition is not matched at step S18, the main feature MP and the sub-feature SP are sufficiently spaced apart, and thus arrangement of the feature is finished.

If the predetermined condition is matched at step S18, the sub-feature SP is moved toward the main feature MP2 along the diagonal lines L1 at step S19 because the main feature MP and the sub-feature SP are located too close to each other. In this occasion, the sub-feature SP is moved so that the distance between the sub-feature SPA after the travel and each of the main features MP1 to MP3 matches the predetermined condition. In addition, the sub-feature SP may be moved to the center point of the diagonal lines L1. This embodiment 4 also brings about the same effect same as that of the embodiment 1.

FIG. 20 illustrates an exemplary variation of the embodiment 4, in comparison with FIG. 19. In the exemplary variation of FIG. 20, the main feature MP4 is formed, not into a square, but into a rectangular shape having its long side along the Y-axis. In this case, the length of the main feature MP4 along the Y-axis is virtually corrected to the length L of another adjacent main feature MP1. Adjusting the length of the main feature MP4 along the Y-axis to another main feature MP1 renders the layout of the main features MP1 to MP4 identical to that shown in FIG. 19. Subsequently, the sub-feature SP is laid by the method of the embodiment 4. This exemplary variation also brings about the same effect as that of the embodiment 2.

It should be noted that the embodiments disclosed herein are for illustrative purposes in all respects and by no means limit the present invention. The scope of the invention is indicated, not by the above description, but by the appended claims, and is intended to include the scope of the claims and any modification within the sense of equivalence and the range thereof.

What is claimed is:

1. A photomask comprising four main features formed based on design information of a circuit feature to be formed on a substrate in order to form an exposure feature corresponding to the circuit feature on the surface of the substrate, wherein each of the main features is formed into a square or rectangular shape and has a first side extending in a first direction and a second side extending in a second direction perpendicular to the first direction, and the four main features are annularly arranged so that a quadrangle is formed by four vertices inside the four main features, when viewed from the center of the four main features, the photomask further comprising a first sub-feature laid at a predetermined position in the quadrangle defined based on the positions of the four vertices of the quadrangle in order to increase a depth of focus of the exposure feature, wherein the first sub-feature is formed into a square or rectangular shape and has a third side extending in the first direction and a fourth side extending in the second direction.

2. The photomask according to claim 1, wherein the predetermined position is an intersection point of two diagonal lines of the quadrangle.

3. The photomask according to claim 2, wherein the predetermined position is a position moved from the intersection point along the diagonal line so that a distance between the first sub-feature and each main feature is larger than a predetermined distance.

4. The photomask according to claim 1, wherein the predetermined position is a centroid of the quadrangle.

5. The photomask according to claim 1, further comprising a second sub-feature provided corresponding to each side of each main feature and arranged in parallel with the corresponding sides in order to increase a depth of focus of the exposure feature, wherein the second sub-feature is formed into a square or rectangular shape and has a fourth side extending in the first direction and a fifth side extending in the second direction.

6. The photomask according to claim 1, wherein each side of the quadrangle is extending in either the first or the second direction.

7. The photomask according to claim 1, wherein at least one of the four sides of the quadrangle is extending in a direction different from both the first and the second directions.

8. A manufacturing apparatus of a semiconductor device comprising an exposure device which forms the exposure feature on the substrate using the photomask according to any one of claims 1 to 7.

9. A manufacturing method of a semiconductor device comprising a step of forming the exposure feature on the substrate using the photomask according to any one of claims 1 to 7.

10. A photomask feature layout method comprising a step of arranging four main features based on design information of a circuit feature to be formed on a substrate in order to form an exposure feature corresponding to the circuit feature on the surface of the substrate, wherein each of the main features is formed into a square or rectangular shape and has a first side extending in a first direction and a second side extending in a second direction perpendicular to the first direction, and the four main features are annularly arranged so that a quadrangle is formed by four vertices inside the four main features, when viewed from the center of the four main features, the method further comprising a step of laying out a sub-feature at a predetermined position in the quadrangle defined based on the positions of the four vertices of the quadrangle in order to increase the depth of focus of the exposure feature, wherein the sub-feature is formed into a square or rectangular shape and has a third side extending in the first direction and a fourth side extending in the second direction.

\* \* \* \* \*